United States Patent [19]

Albright et al.

[11] Patent Number: 4,667,148
[45] Date of Patent: May 19, 1987

[54] GENERATOR AIR-GAP FLUX PROBE FOR DETECTING SHORTED ROTOR TURNS

[75] Inventors: Donald R. Albright, Scotia; William D. Jones, Schenectady; Doran W. Nelson, Clifton Park, all of N.Y.

[73] Assignee: General Electric Company, Schenectady, N.Y.

[21] Appl. No.: 749,146

[22] Filed: Jun. 26, 1985

[51] Int. Cl.$^4$ ............... G01R 31/02; G01R 31/34; G01N 27/87
[52] U.S. Cl. .................................. 324/51; 324/149; 324/158 MG; 324/260
[58] Field of Search ........ 324/51, 149, 72.5, 158 MG, 324/158 P, 207, 208, 236, 237, 173, 174, 260; 73/660, 661; 310/68 B, 68 E, 168; 318/490

[56] References Cited

U.S. PATENT DOCUMENTS

| | | | |
|---|---|---|---|
| 3,506,914 | 4/1970 | Albright et al. | 324/173 X |
| 3,676,776 | 7/1972 | Bauer et al. | 324/158 P X |
| 3,890,517 | 6/1975 | Marsh et al. | 324/173 X |
| 4,078,185 | 3/1978 | Singbartl | 310/168 |
| 4,196,390 | 4/1980 | Pitkin | 324/173 X |

*Primary Examiner*—Gerard R. Strecker
*Attorney, Agent, or Firm*—Jerome C. Squillaro

[57] ABSTRACT

A generator air-gap flux probe for determining rate of change of flux density includes a resilient support spanning the air gap between the stator and the rotor of a dynamoelectric machine to support radial and/or tangential flux coils stably within a short distance of the rotor. The resilient support permits the portion of the flux probe spanning the air gap to deflect substantially during assembly or disassembly of the machine thereby to permit permanent installation of the air-gap flux probe. In one embodiment adapted to longer air gaps, the flux probe is mounted on a pedestal block installed on a dovetail slot wedge in the stator. This reduces the cantilevered distance which the flux probe must span. A tangential flux coil axis stripe marking the axis of the tangential flux coil aids in alignment.

13 Claims, 11 Drawing Figures

GENERATOR AIR-GAP FLUX PROBE FOR DETECTING SHORTED ROTOR TURNS

BACKGROUND OF THE INVENTION

The present invention relates to dynamoelectric machines and, more particularly, to apparatus for sensing one or more shorted turns in a rotor field of a large dynamoelectric machine.

A large synchronous dynamoelectric machine such as, for example, a large turbine-generator, employs the interaction of magnetic fields in its rotor and stator to produce electric power. In order to simplify the high-power output connections, the high AC output power is conventionally generated in the stator which operates as an armature. A plurality of field windings on the rotor are conventionally excited by a DC field supply. The DC field supply is generated either by an external DC exciter generator and fed through slip rings to the rotor field windings, or in a brushless generator-rectifier assembly rotating with the rotor.

Each of the field windings consists of a plurality of mutually insulated conductor bars disposed in slots in the rotor where they are retained by radial force generated by dovetail wedges fitted into dovetail slots in the rotor. End turns interconnecting the ends of the conductor bars are held in place by retaining rings which may be thermally shrunk or fitted into place. The dovetail wedges and the retaining rings support the field windings and end turns, respectively, against centrifugal forces tending to urge them outwardly.

Rotors of large turbine-generators conventionally have two, four or more poles formed by the arrangement of the slots containing the field windings and by the method of interconnection. For purposes of concreteness of description, a two-pole turbine-generator is illustrated and described herein, it being understood that the invention is not limited to such an embodiment.

A two-pole rotor includes a plurality of slots disposed parallel to the axis of a cylindrical forging. A conventional rotor may contain from as few as 8 to as many as 18 or more slots on each side of a pole axis bisecting the rotor. The slots are symmetrically arranged with respect to the pole axis and the slots and windings are arranged to produce a flux field which approximates a sine wave in space. Each slot contains a plurality of mutually insulated bars. In one generator, for example, a total of 14 slots are employed on each side of the pole axis whose conductor bars are interconnected by end turns to create seven coils per pole. The four slots nearest the poles each coontain seven conductor bars and the remainder of the slots each contain eleven conductor bars.

The insulation separating the conductor bars or end turns of a rotor of the above type may break down for reasons which are not of concern to the present discussion. Such an insulation breakdown may place a short circuit across one or more of the turns in a winding. Short circuited turns may exist at a standstill or may only occur when the conductor bars or end turns are outwardly loaded by centrifugal forces. The former may be detected by static tests whereas the latter may only be detected in a rotor turning at or near its operational speed.

U.S. Pat. No. 3,506,914, the disclosure of which is herein incorporated by reference, describes a method and apparatus for sensing the rate of change of radial and tangential flux as each slot in a field rotor passes a search coil. In summary, a search coil arranged to sense radial and/or tangential flux is disposed close to the surface of the spinning rotor. Leakage flux from the rotor slots induces voltages in the search coil as the slots rotate therepast. The induced voltages from the search coil drive an oscilloscope. Irregularities in the pattern of peaks and valleys displayed on the oscilloscope is interpreted in a disclosed manner to determine whether one or more turns are shorted and to identify the slot or slots in which the shorted turns are located. The technique is considered sensitive enough to determine the number of shorted turns associated with a rotor slot.

The high economic value of a large turbine-generator, and the high cost of replacing its power during an outage, strongly encourage maintaining the turbine-generator in operation as long as safe operation can be continued. The same reasons make it valuable to achieve repair and service resumption with minimum delay. A small number of shorted field turns is not generally considered to represent a catastrophic failure requiring taking the generator off line and attempting a repair. Instead, satisfactory operation may be continued with one or more shorted turns.

Besides reducing the field flux generated by the conductor bars in one or more slots, a shorted turn also changes the power dissipated in the affected winding. Such changes in power dissipation can produce non-uniform heating of the rotor and result in thermally-induced distortion and rotor vibration. When the pattern of shorted turns in the rotor slots permits it, such rotor vibration is preferably cured by balancing. If the pattern of shorted turns is asymmetrically distributed on the rotor, such balancing may be ineffective and a disassembly and repair of the affected conductor bars may be required. Such disassembly and repair is not undertaken lightly since it consumes a significant amount of time and invokes a probability that the conduct of the work may create faults which were not present before the start of the work.

The flux changes sensed by the apparatus of the above-referenced patent provides information which can guide the decision between balancing and repair. In addition, the information is sufficient to identify individual slots containing shorted turns, as well as the number of shorted turns contained therein.

The referenced patent requires the disposition of the search coil within a relatively short distance from the peripheral surface of the rotor. Best operation requires a radial spacing of the search coil from the peripheral surface of the rotor of from about 0.5 to about 1.00 inch. Since the retaining rings at the ends of the rotor have a radius of about 1.5 inch greater than the radius of the rotor, a search coil installed at the required spacing during manufacture of the stator of the turbine-generator would be destroyed by the retaining rings when the rotor is installed. The referenced patent provides a temporary probe which is inserted through a gas-tight sealing gland in the wrapper of the turbine-generator and through one of the core tooth vent ducts in the stator to place its extremity containing the search coil at the required distance from the rotor peripheral surface. Since the probe interferes with cooling gas flow through the core tooth vent duct which is occupies, it is desirable to limit the use of the measurement technique to short periods. Extended operating periods could also produce vibration damage to the probe.

Although, as noted above, a small number of shorted turns in a field rotor is not generally considered to be a serious problem, continued refinement of electric power-generation and control equipment, and the availability of techniques for analyzing and recording the data therefrom, makes it desirable to provide a flux search probe which can permanently be installed in the stator during the manufacture thereof and which can withstand the subsequent assembly and operational environments, particularly the installation of the rotor, without damage to the probe or to the turbine-generator.

OBJECTS AND SUMMARY OF THE INVENTION

It is an object of the invention to provide a generator air-gap flux probe which permits permanent installation thereof without incurring damage to the probe or the generator during subsequent operation and use.

It is a further object of the invention to provide a generator air-gap flux probe having a resilient portion capable of permitting deflection of at least an outer portion of the flux probe during assembly of the generator, especially insertion of the rotor, and capable of resiliently restoring itself to a position where a flux search coil is stable within a predetermined distance from a peripheral surface of the generator rotor.

Briefly stated, the present invention provides a generator air-gap flux probe, for determining rate of change of flux density, which includes a resilient support spanning the air gap between the stator and the rotor of a dynamoelectric machine to stably support radial and/or tangential flux coils within a short distance of the rotor. The resilient support permits the portion of the flux probe spanning the air gap to deflect substantially during assembly or disassembly of the machine thereby to permit permanent installation of the air-gap flux probe. In one embodiment adapted to longer air gaps, the flux prove is mounted on a pedestal block installed on a dovetail slot wedge in the stator. This reduces the cantilevered distance which the flux probe must span.

The above, and other objects, features and advantages of the present invention will become apparent from the following description read in conjunction with the accompanying drawings, in which like reference numerals designate the same elements.

DETAILED DESCRIPTION OF THE PREFERRED EMBODIMENT

Figure 1:
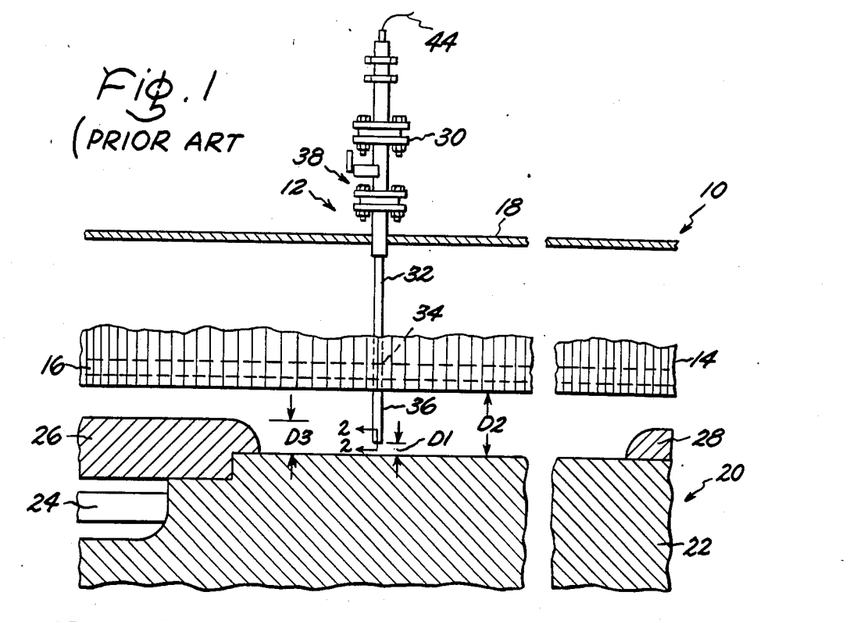
FIG. 1 is a partial cross-section of a turbine-generator air gap including a flux probe according to the prior art.

Referring to FIG. 1, there is shown, generally at 10, a portion of a turbine-generator including an air-gap flux probe 12 as disclosed in the above-referenced U.S. patent. Turbine-generator 10 includes an annular stator core 14 conventionally built up of a plurality of individual laminations. Stator or armature windings (not shown) are retained in slots in stator core 14 using dovetail wedges 16, one of which is indicated in dashed line. An outer casing or wrapper 18 surrounds turbine-generator 10. As is conventional, the interior of turbine-generator 10 is cooled by a flow of a pressurized cooling gas such as, for example, air or hydrogen. Wrapper 18 therefore forms a part of a gas-tight pressure vessel for containing the cooling gas.

A rotor 20 is coaxially disposed within stator core 14. Rotor 20 generally consists of a single rotor forging 22 into which a plurality of slots (not shown) are machined parallel to the longitudinal axis thereof. A plurality of mutually insulated conductor bars (not shown) are disposed in each slot wherein they are retained by dovetail wedges (not shown). The ends of the conductor bars are interconnected by end turns 24 to interconnect the individual conductor bars thereby forming the turns of the field coils in rotor 20. End turns 24 are retained in place against the outward urging of centrifugal acceleration by retaining rings 26 and 28 shrunk-fit on opposed ends of rotor forging 22.

Air-gap flux probe 12 includes a support and seal assembly 30 for permitting the insertion of a flux probe wand 32 through wrapper 18. Support and seal assemby 30 is aligned with a core-vent duct 34 thereby permitting an end of flux probe wand 32 to pass to within an operational distance D1 of rotor forging 22. The structure of support and seal assembly 30 is fully detailed in the referenced U.S. patent and further description thereof is omitted herefrom.

Test results suggest that operational distance D1 is preferably from about 0.5 to about 1.00 inch for satisfactory operation. A radial distance, or air-gap length, D2, is established between the facing surfaces of stator core 14 and rotor forging 22. Air-gap length D2, depending on the design of turbine-generator 10, is generally from about two to about six inches. Thus, an unsupported protruding portion 36 of flux probe wand 32 extends from about 1.25 to about 5.75 inches beyond core-vent duct 34. Retaining rings 26 and 28 extend radially outward a distance D3 beyond the surface of rotor forging 22. Distance C3 is conventionally about 1.5 inch.

The above typical dimensions illustrate that flux probe wand 32 may not be permanently installed during manufacture of turbine-generator 10 since protruding portion 36 would be destroyed by interference with retaining ring 26 or retaining ring 28 when rotor 20 is fitted into stator core 14. Furthermore, permanent installation of flux probe wand 32 after assembly of turbine-generator 10 is not favored since reduced coolant flow through core-vent duct 34 may have an adverse effect on the thermal environment within turbine-generator 10. Finally, in order to support the flux search coils stably within operational distance D1 of rotor forging 22 against vibration induced by rotor vibration and windage, flux probe wand 32 is made of rigid material. Such rigid material may be subject to breakage which could produce damaging foreign objects within the air gap. As a consequence, it is customary to limit the use of flux probe wand 32 to periodic checks. Between the periodic checks, flux probe wand 32 is withdrawn from support and seal assembly 30. A seal 38 in support and seal assembly 30 is closed to prevent the escape of the coolant gas from within wrapper 18.

Figure 2:
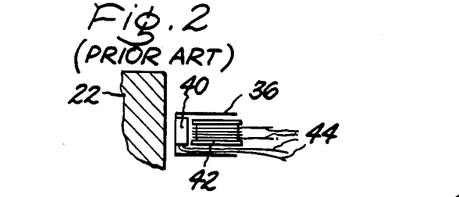
FIG. 2 is a cross-section of the sensor area of the flux probe of FIG. 1 showing the location of radial and tangential flux coils.

Referring now to FIG. 2, a cross-section of the end of flux probe wand 32 includes a radial flux coil 40 consisting of a plurality of turns of a fine wire with the axes of the turns disposed parallel to the axis of flux probe wand 32. In addition, the end of flux probe wand 32 contains a tangential flux coil 42 consisting of a plurality of turns of fine wire with the axes of the turns disposed parallel to a tangent to the surface of rotor forging 22. The number and dimensions of turns required in radial flux coil 40 and tangential flux coil 42 depend on the desired sensitivity of the sensing device. In the preferred embodiment, about 200 turns of 0.005 inch insulated wire provides a satisfactory sensitivity to drive an oscilloscope (not shown). Radial flux coil 40 may employ circular turns having a diameter of about 0.125 inch. Tangential flux coil 42 may employ rectangular turns having dimensions of about 0.125 by 0.375 inch. Other sizes and numbers of turns may also be employed without departing from the scope of the invention. Signal leads 44 from radial flux coil 40 and tangential flux coil 42 pass through flux probe wand 32 for external connection to sensing devices (not shown).

Figure 3:
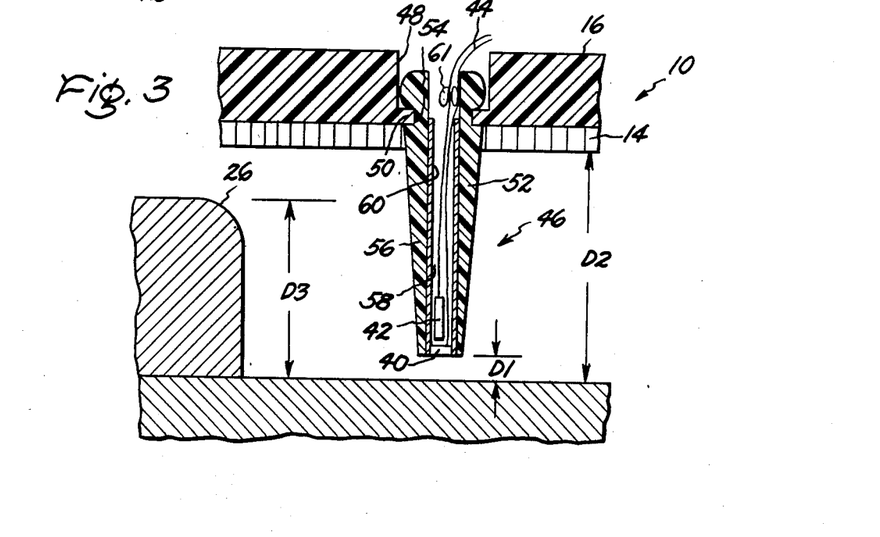
FIG. 3 is a partial cross-section of a turbine-generator air gap including a flux probe according to an embodiment of the invention.

Referring now to FIG. 3, taken through a dovetail wedge 16 parallel to the axis of turbine-generator 10, a flux probe 46, according to an embodiment of the invention, is permanently installed in turbine-generator 10 during manufacture and stably supports radial flux coil 40 and tangential flux coil 42 at operational distance D1 from the surface of rotor forging 22. This permits installation and removal of rotor forging 22 without damage or fracture of flux probe 46 into foreign objects. A mounting hole 48, passing through dovetail wedge 16, includes a circular flange 50 surrounding its radially inner extremity. A probe wand 52 includes an annular groove 54 fittable over circular flange 50. Probe wand 52 is preferably of an elastomeric material such as, for example, a rubber, a synthetic rubber or an elastomeric plastic material capable of withstanding the chemical environment and temperature of up to about 100 degrees C. within turbine-generator 10. The resilience of probe wand 52 enables installation of annular groove 54 on circular flange 50 in a manner similar to that employed in installing a valve stem in a wheel of a tubeless pneumatic tire. A protruding portion 56 of probe wand 52 supports radial flux coil 40 and tangential flux coil 42 at the required operational distance D1 from rotor forging 22. An axial channel 58, centrally disposed in probe wand 52, permits running signal leads 44 from radial flux coil 40 and tangential flux coil 42 therethrough leading to suitable conventional terminals (not shown) for connection to sensing circuits external to turbine-generator 10.

In the embodiment of flux probe 46 shown in FIG. 3, protruding portion 56 is in the shape of a frustum. This provides a relatively wide base at circular flange 50 and annular groove 54 for stable support. In some installations, the elastomeric material from which probe wand 52 is formed may be selected to provide the required stiffness for stable support of radial flux coil 40 and tangential flux coil 42. In other installations, a stiffening liner 60 of a suitable material may be disposed in axial channel 58. Stiffening liner 60 is preferably of a fiber-resin matrix or a cast resin material. Non-magnetic materials, such as stainless steel and brass, may also be employed in stiffening liner 60. It is contemplated that probe wand 52 be integrally mounded upon stiffening liner 60. Whan probe wand 52 is molded on stiffening liner 60, stiffening liner 60 may contain radial flux coil 40, tangential flux coil 42 and signal lead 44 as a subassembly, or radial flux coil 40, tangential flux coil 42 and signal lead 44 may be installed after molding. Stiffening liner 60 may extend for the full length of protruding portion 56 from the distal end thereof to a point adjacent annular groove 54. Alternatively, stiffening liner 60 may terminate short of the positions shown at either end thereof. In addition, instead of being a single tubular element as shown, stiffening liner 60 may be formed in two or more coaxial parts and arranged either concentrically or end-to-end.

In order to avoid stressing signal leads 44, a service loop 61, or other means for permitting deflection of probe wand 52 without breaking signal leads 44, is desirable. Upon exiting axial channel 58, signal leads 44 are routed in any convenient manner to the external circuits. For example, signal leads 44 may be routed within or without dovetail wedge 16 as is convenient. The routing of signal leads 44 external to flux probe 46 in this embodiment is not considered to contain an inventive part of the present disclosure and therefore is omitted.

Figure 4:
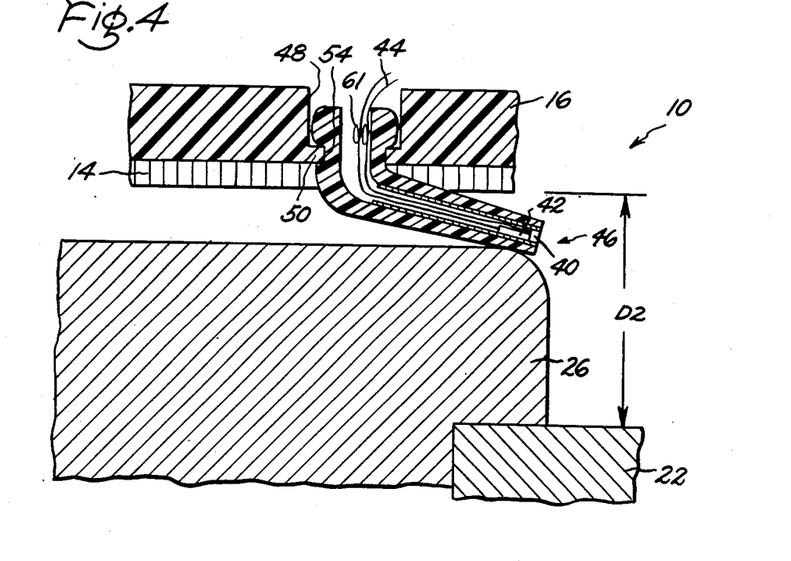
FIG. 4 is a partial cross-section corresponding to FIG. 3 shown with the flux probe being deflected during assembly or disassembly of the turbine-generator.

Referring now to FIG. 4, turbine-generator 10 is shown during installation or removal of rotor forging 22 from stator core 14. Protruding portion 56 of flux probe 46 is deflected by contact with retaining ring 26 thereby allowing retaining ring 26 therepast. Once retaining ring 26 is clear of flux probe 46, the elastomeric material of protruding portion 56 snaps protruding portion 56 back into its stable supporting position. Thus, flux probe 46 may be permanently installed in turbine-generator 10 during manufacture of stator core 14.

Figure 5:
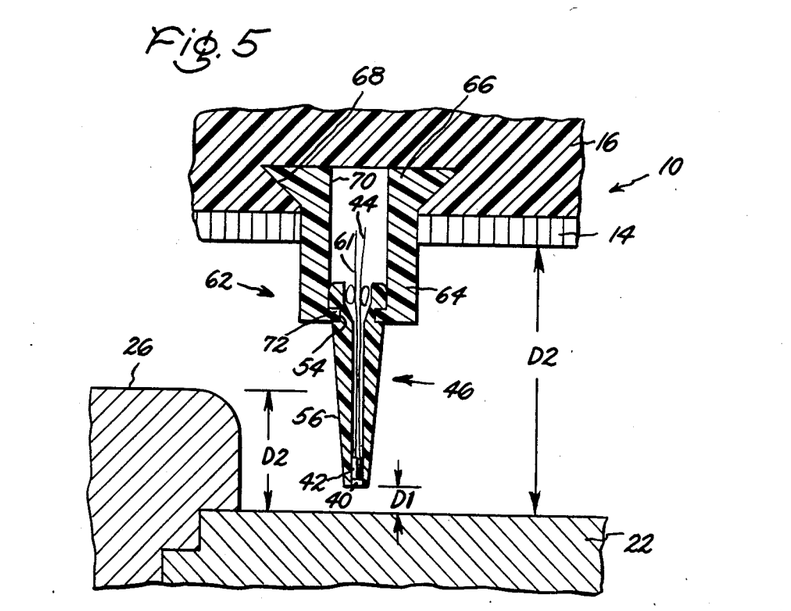
FIG. 5 is a partial cross-section of a flux probe according to an embodiment of the invention for use with long air gaps.

In some apparatus air gap length D2 may be as great as 6 inches or more. Such a large value for air gap length D2 may make it difficult to support radial flux coil 40 and tangential flux coil 42 with stability. Referring now to FIG. 5, there is shown a flux probe assembly 62 which addresses this problem used a pedestal 64 having a dovetail 66 at its base fitted into a transverse dovetail slot 68 formed transversely in dovetail wedge 16. A mounting hole 70 in pedestal 64 includes a circular flange 72 cooperating with annular groove 54 of flux probe 46 as in the previously described embodiment. By reducing the cantilevered length of protruding portion 56, the stability of radial flux coil 40 and tangential flux coil 42 is improved while still permitting assembly and disassembly of turbine-generator 10, thereby providing a permanent mounting system for flux probe 46. Pedestal 64 can be of any convenient non-magnetic, and preferably non-metallic, material such as, for example, a fabric-reinforced resin material.

Figure 6:
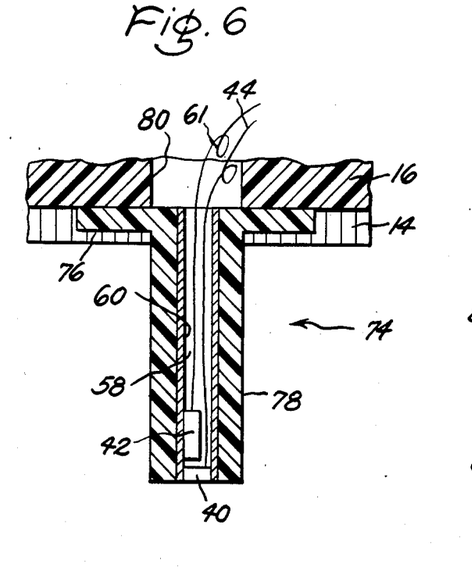
FIG. 6 is a cross-section of a portion of a turbine-generator air gap including a flux probe according to a further embodiment of the invention.

Referring now to FIG. 6, there is shown a flux probe 74 according to a further embodiment of the invention. Flux probe 74 includes a mounting flange 76 which is surface mounted to dovetail wedge 16 by any convenient means such as, for example, by an adhesive layer (not shown). A protruding portion 78, which may have any convenient cross-section such as, for example, circular, rectangular or a low-drag aerodynamic shape, is stably supported by mounting flange 76. An axial cross-section of protruding portion 78 may be rectangular as shown or may be a truncated triangle as in the previously described embodiments.

Mounting flange 76 is preferably of an elastomeric material having a resilience suitable to permit protruding portion 78 to deflect upon contact with retaining ring 26 during installation and removal of rotor forging 22, and a stiffness suitable to support protruding portion 78 stably at other times. Protruding portion 78 is also preferably of an elastomeric material and most preferably of the same elastomeric material as mounting flange 76 to permit forming of both of these elements in a single molding operation. A hole 80 in dovetail wedge 16 permits the exit of signal leads 44. Protruding portion 78 may contain stiffening liner 60 lining its axial channel 58 as previousy detailed.

Figure 7:
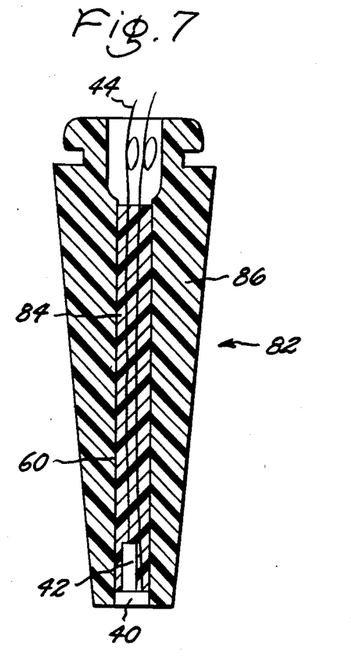
FIG. 7 is a cross-section of a flux probe according to a still further embodiment of the invention.

Referring now to FIG. 7, a further embodiment of a flux probe 82 is shown in which stiffening liner 60 is filled by a cylindrical solid 84 which may be, for example, a plastic resin, cast or otherwise formed, about signal leads 44 passing therethrough and may optionally also be formed about radial flux coil 40 and tangential flux coil 42. Cylindrical solid 84 may be formed by filling stiffening liner 60 with a curable resin after an elastomeric body 86 is formed and radial flux coil 40, tangential flux coil 42 and signal leads 44 are installed therein. Alternatively, a subassembly consisting of cylindrical solid 84 formed and cured upon radial flux coil 40, tangential flux coil 42 and signal leads 44 may subsequently have elastomeric body 86 cast upon it. The type and stiffness of material forming cylindrical solid 84 is chosen to provide the combination of stiffness and resilience to flux probe 82 as defined in the preceding embodiments.

Figure 8:
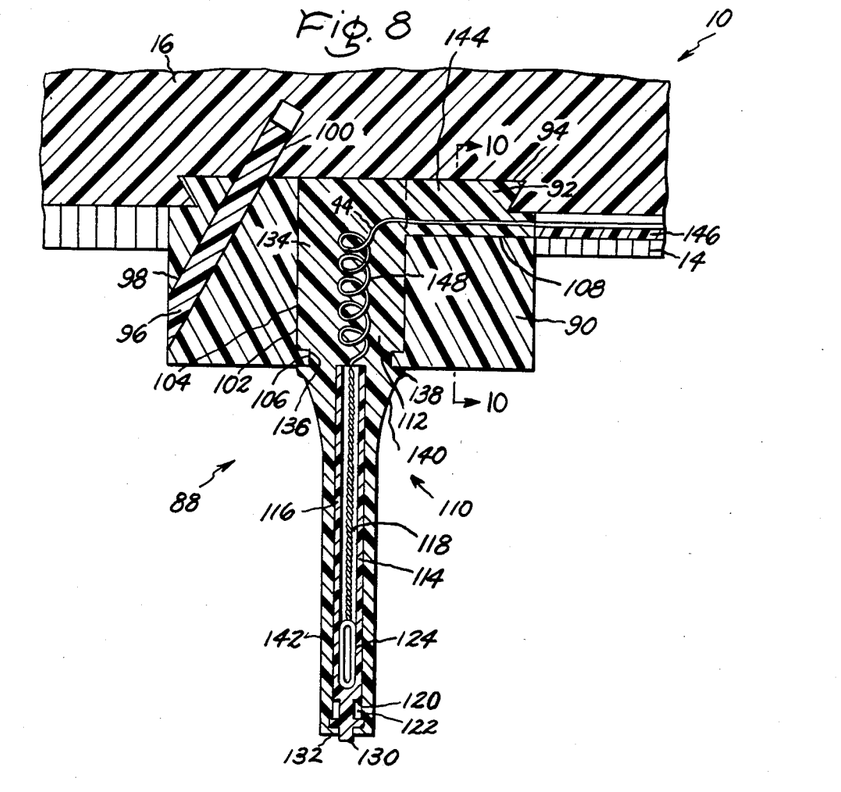
FIG. 8 is a partial cross-section of a turbine-generator air gap showing a flux probe according to a still further embodiment of the invention.

Referring now to FIG. 8, there is shown, generally at 88, an air-gap flux probe according to a further preferred embodiment of the invention. A pedestal block 90 includes a dovetail 92 fitted into a transverse dovetail slot 94 in dovetail wedge 16. Dovetail 92 is preferably retained in transverse dovetail slot 94 by cementing using, for example, a conventional epoxy adhesive. For additional security, at least one, and preferably two locking bers 96 (only one of which is shown) are closely fitted into respective diagonal holes 98 in pedestal block 90 and aligned diagonal holes 100 in dovetail wedge 16. Locking bars 96 are preferably also cemented in place.

A mounting hole 102 through pedestal block 90 includes a cylindrical portion 104 and a circular flange 106 at its extremity. A wire exit channel 108 extends in an axial direction of turbine-generator 10.

Figure 9:
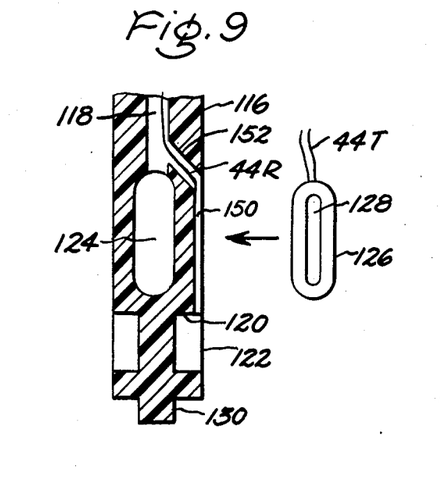
FIG. 9 is an exploded side view of a partially assembled flux probe of FIG. 8.

A flux probe 110 includes an elastomeric body 112 supporting flux probe 110 in pedestal block 90 and covering and supporting a coil assembly 114. Coil assembly 114 includes a non-metallic rod 116 having an axial bore 118 formed along a portion of its length. Referring now also to FIG. 9, an annular groove 120 in non-metallic rod 116 serves as a bobbin upon which a radial flux coil 122 is wound. A transverse slot 124, preferably passing completely through non-metallic rod 116, is sized to receive a tangential flux coil 126 therein. Tangential flux coil 126 preferably includes an elongated bobbin 128 upon which the winding is formed. An alignment extension 130 preferably extends axially beyond annular groove 120. Alignment extension 130 is employed for maintaining alignment of non-metallic rod 116 in a mold (not shown) while elastomeric body 112 is molded about non-metallic rod 116 and is cut off as close to the end of annular groove 120 as possible after flux probe 110 is removed from the mold.

Referring again only to FIG. 8, when non-metallic rod 116 is mounted in the mold for forming elastomeric body 112, the outer extremity of radial flux coil 122 is preferably held slightly elevated above the bottom of the mold in order to form a web 132 covering the extremity of radial flux coil 122 except for the portion penetrated by alignment extension 130. Elastomeric body 112 further includes a cylindrical base 134 closely fittable into cylindrical portion 104, and an annular groove 136 fittable over circular flange 106. An annular ridge 138 provides a minor amount of retention of elastomeric body 112 in position in mounting hole 102 once it has been pulled into that position. This assists in holding elastomeric body 112 to await setting of an adhesive material, applied to mounting hole 102 and annular groove 136 prior to assembly.

It will be noted that an inner end of non-metallic rod 116 terminates generally in the same plane as the outer surface of pedestal block 90. A frustum 140 of elastomeric body 112 extends outward from annular ridge 138 to improve the holding stability of elastomeric body 112 in the transition region from the supported portion to an unsupported protruding portion 142 of elastomeric body 112.

Figure 10:
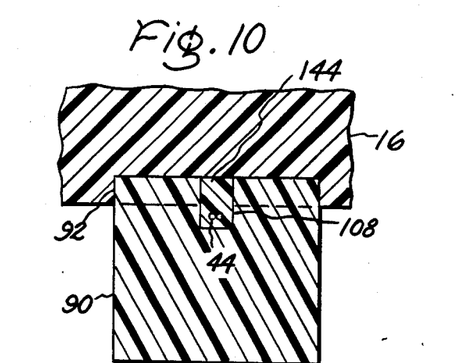
FIG. 10 is a cross-section taken along X—X in FIG. 8.

Referring now to the cross-section shown in FIG. 10, wire exit channel 108 preferably has a rectangular cross-section. A wire-support portion 144 of elastomeric body 112 (FIG. 8) is preferably also formed with a rectangular cross-section closely fitting into wire exit channel 108. It will be noted that signal leads 44 are molded into wire-support portion 144 in a position where they clear dovetail 92 and thus emerge parallel to, and spaced closely from, the surface of dovetail wedge 16. Portions of signal leads 44 outside wire-support portion 144 are preferably wrapped with a conventional protective tape 146 (FIG. 8) such as, for example, a spiral wrapping of a glass fiber cloth tape having a self-adhesive layer on one surface thereof. Signal leads 44 and protective tape 146 are preferably adhered to the surface of dovetail wedge 16 using, for example, an epoxy adhesive, in order to prevent any looseness of these elements while in use.

Returning now to FIG. 8, signal leads 44 are formed into a helical service strain relief 148 before molding within elastomeric body 112. Helical service strain relief 148 permits substantial motion of protruding portion 142 without placing a sufficient strain on signal leads 44 within this region to cause breakage of singal leads 44. One skilled in the art would immediately recognize that other acceptable methods of providing strain relief to signal leads 44 are possible. For example, instead of integrally molding signal leads 44 into elastomeric body 112, a cavity (not shown) may be molded, or otherwise formed, in elastomeric body 112 between an inner extremity of non-metallic rod 116 and wire-support portion 144. Signal leads 44 may be formed into a loop or helix within the cavity for providing equivalent strain relief.

Returning to FIG. 9, signal leads 44 from tangential flux boil 126 are identified with the suffix T and those from radial flux coil 122 are identified with the suffix R. Signal leads 44 T from tangential flux coil 126 are preferably routed into axial bore 118 where it joins transverse slot 124. Signal leads 44 R from radial flux coil 122 may be run in a surface channel 150 to a point where access to axial bore 118 may be obtained using, for example, a entry channel 152. Once tangential flux coil 126, radial flux coil 122 and signal leads 44 T and R are in place, a conventional potting material such as, for example, a room-temperature curing epoxy, is preferably formed over the surface of non-metallic rod 116, filling transverse slot 124 around tangential flux coil 126, stabilizing the windings of radial flux coil 122 and sealing signal leads 44 R in surface channel 150 and entry channel 152. A suitable sleeve (not shown) may be temporarily installed over the potting material to provide the desired smooth final cylindrical surface shape.

An embodiment of the invention is contemplated in which axial bore 118 stops short of transverse slot 124. In order to provide entry of signal leads 44 T to axial bore 118, a further surface channel and entry channel, corresponding to surface channel 150 and entry channel 152, are provided in non-metallic rod 116.

Elastomeric body 112 (FIG. 8) is made of any convenient material having the desired combination of rigidity, resilience, moldability and long-term resistance to environmental degradation. In the preferred embodiment a room-temperature-vulcanizing silicone rubber such as, for example, a silicone rubber sold under the trademark "RTV" by the General Electric Company may be employed.

Figure 11:
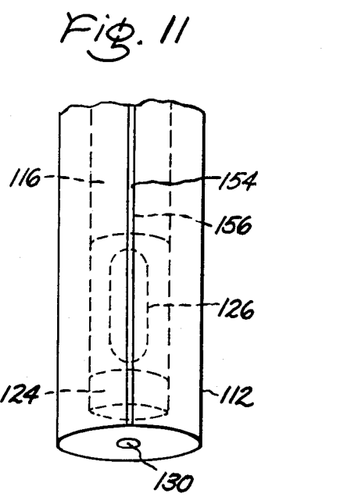
FIG. 11 is a perspective view of the surface of a portion of the flux probe of FIG. 8 showing a tangential flux coil axis stripe.

Referring now to FIG. 11, it would be clear to one skilled in the art that the axis of tangential flux coil 126 must be accurately aligned with a tangent to turbine-generator 10. It is therefore desirable to place a tangential flux coil axis stripe 154 on the surface of elastomeric body 112 to mark the axis of tangential flux coil 126. Tangential flux coil axis stripe 154 may optionally continue from the axial surface of elastomeric body 112 to form a line across the end of elastomeric body 112. Tangential flux coil axis stripe 154 provides an alignment reference for assembling flux probe 110 into pedestal block 90 (FIG. 8). The light-colored silicone rubber of which elastomeric body 112 is formed is well known for resisting adhesion of paint and most other conventional materials which would otherwise be suitable for forming tangential flux coil axis stripe 154. A durable marking material may be produced by mixing a carbon black with an amount of the same silicone rubber from which elastomeric body 112 is formed in proportions effective to darken the silicone rubber. This mixture is then used to form tangential flux coil axis stripe 154. Since a major portion of the darkened mixture is the same silicone rubber of which elastomeric body 112 is formed, suitable permanent adhesion is provided. The application of tangential flux coil axis stripe 154 may be guided by a groove 156 formed in elastomeric body 112 during molding thereof. It is thus necessary only to fill the groove to ensure that a satisfactory alignment is provided between the axis of tangential flux coil 126 and tangential flux coil axis stripe 154. In one embodiment of the invention, groove 156 is employed without requiring tangential flux coil axis stripe 154, the depression formed by groove 156 being a sufficient indicator of the location of the axis of tangential flux coil 126.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. An air-gap flux probe assembly for sensing a flux in an air gap of a dynamoelectric machine, the dynamoelectric machine being of a type having an annular stator core with a cyindrical rotor coaxially disposed within the annular stator core; an annular space between the rotor and the stator defining the air gap, wherein the air-gap flux probe assembly comprises:

a flux probe having at least one flux coil mounted within the flux probe at one end thereof, the flux probe having an elastomeric body for stably supporting the flux coil within an operational distance from said rotor but being deflectable for assembly and disassembly of the rotor relative to the annular stator core;

means for mounting the flux probe at a second end thereof to a radially inner surface of the stator core, said mounting means including at least one dovetail wedge disposed with said stator core and having a mounting hole formed therethrough; the mounting hole being formed with an inwardly directed circular flange; and, an annular groove formed on the surface of the flux probe elastomeric body at said second end of said flux probe for engaging the mounting hole circular flange whereby the flux probe may be mounted to the radially inner surface of the stator core.

2. An air-gap flux probe assembly according to claim 1 wherein the flux probe includes a rigid portion supporting the at least one flux coil; the elastomeric body surrounding the rigid portion and extending radially outward beyond the rigid portion to said mounting hole; the rigid portion terminating at a distance with respect to the mounting hole effective to permit substantial mechanical deflection of the probe elastomeric body in the rotor axis direction.

3. An air-gap flux probe assembly according to claim 2 wherein said rigid portion includes a rod.

4. An air-gap flux probe assembly according to claim 3 wherein said at least one flux coil includes a radial flux coil and said rod includes an annular groove therein into which said radial flux coil is wound.

5. A air-gap flux probe assembly according to claim 4 wherein said at least one flux coil further includes a tangential flux coil and said rod includes a transverse slot therein, said tangential flux coil being fitted within said transverse slot.

6. An air-gap flux probe assembly according to claim 2 wherein said elastomeric body includes an axial channel and said rigid portion includes a stiffening liner in said axial channel.

7. An air-gap flux probe assembly according to claim 1 wherein said at least one flux coil includes at least a tangential flux coil, said tangential flux coil having an axis and said flux probe includes indicating means for indicating said axis.

8. An air-gap flux probe assembly according to claim 7 wherein said indicating means includes a tangential flux coil axis stripe.

9. An air-gap flux probe assembly according to claim 8 wherein said indicating means further includes a groove containing said tangential flux coil axis stripe.

10. An air-gap flux probe assembly according to claim 7 wherein said indicating means includes a groove in a surface of said flux probe.

11. An air-gap flux probe assembly for sensing a flux in an air gap of a dynamoelectric machine, the dynamoelectric machine being of a type having an annular stator core with a cylindrical rotor coaxially disposed within the annular stator core; an annular space between the rotor and the stator defining the air gap, wherein the air-gap flux probe assembly comprises:

a flux probe having at least one flux coil mounted within the flux probe at one end thereof, the flux probe having an elastomeric body for stably supporting the flux coil within an operational distance from said rotor but being deflectable for assembly and disassembly of the rotor body relative to the annular stator core;

means for mounting the flux probe at a second end thereof to a radially inner surface of said stator core, said mounting means including at least one dovetail wedge disposed within said stator core and having a pedestal block fitted to the dovetail wedge, the pedestal block having a mounting hole therein; the mounting hole being formed with an inwardly directed circular flange; and, an annular groove formed on the surface of the flux probe elastomeric body at said second end of said flux probe engageable with the circular flange whereby the flux probe may be mounted to the radially inner surface of the stator core.

12. An air-gap flux probe assembly according to claim 11 wherein said pedestal block and said dovetail wedge include aligned holes therein and at least one locking bar is fittable with said aligned holes for securing said pedestal block in place on said dovetail wedge.

13. An air-gap flux probe assembly for sensing a rate of change of flux density in an air gap of a dynamoelectric machine, said dynamoelectric machine being of a type having an annular stator core with a cylindrical rotor coaxially disposable therein, an annular space between said rotor and said stator core being said air gap, comprising:

a least one dovetail wedge in said stator core;

a transverse dovetail slot in a surface of said at least one dovetail wedge;

a pedestal block;

a dovetail in said pedestal block fittable into said transverse dovetail slot;

aligned holes in said at least one dovetail wedge and said pedestal block;

a locking bar tightly fittable into said aligned holes for securing said pedestal block to said at least one dovetail wedge;

said pedestal block having a dimension effective for extending part way across said air gap toward said rotor;

a mounting hole through said pedestal block;

a flux probe;

a non-metallic rod in said flux probe;

at least one flux coil at a first end of said flux probe;

an elastomeric body substantially enclosing said non-metallic rod and having a base portion extending a substantial distance beyond a second end of said non-metallic rod;

cooperating means in said mounting hole and said base portion for supporting said base portion; and a protruding portion of said elastomeric body including means for stably supporting said at least one flux coil at an operational distance from said rotor.

* * * * *